United States Patent [19]

Matsushima et al.

[11] Patent Number: 5,150,327
[45] Date of Patent: Sep. 22, 1992

[54] SEMICONDUCTOR MEMORY AND VIDEO SIGNAL PROCESSING CIRCUIT HAVING THE SAME

[75] Inventors: Junko Matsushima, Kashihara; Hironori Akamatsu, Osaka, both of Japan

[73] Assignee: Matsushita Electric Industrial Co., Ltd., Osaka, Japan

[21] Appl. No.: 752,919

[22] Filed: Aug. 29, 1991

Related U.S. Application Data

[63] Continuation of Ser. No. 429,527, Oct. 31, 1989, abandoned.

[30] Foreign Application Priority Data

Oct. 31, 1988 [JP] Japan ................... 63-273326

[51] Int. Cl.$^5$ ............................ G11C 7/00; G11C 8/00
[52] U.S. Cl. ........................... 365/189.01; 365/189.04; 365/219; 365/221; 365/230.08
[58] Field of Search ..................... 365/189.01, 189.04, 365/189.05, 219, 221, 230.03, 230.04, 230.08

[56] References Cited

U.S. PATENT DOCUMENTS

| | | | |
|---|---|---|---|
| 4,633,441 | 12/1986 | Ishimoto | 365/219 X |
| 4,847,809 | 7/1989 | Suzuki | 365/189.04 |
| 4,870,621 | 9/1989 | Nakada | 365/219 X |
| 4,882,710 | 11/1989 | Hashimoto et al. | 365/221 X |
| 4,937,788 | 6/1990 | Harada | 365/189.04 |

OTHER PUBLICATIONS

Nikkei Electronics No. 404; Sep. 22, 1986; pp. 199–217.

*Primary Examiner*—Alyssa H. Bowler
*Attorney, Agent, or Firm*—Lowe, Price, Leblanc & Becker

[57] ABSTRACT

A semiconductor memory includes a writing circuit for dividing data continuously supplied to a serial data input circuit into a plurality of bits, a serial data output circuit for continuously providing data read out a plurality of bits a a time by a reading circuit, a memory cell array including a column decoder and a row decoder, column and row address buffers for instructing addresses for a plurality of bits at a time to the respective column and row decoders, an address generator, and a circuit provided between the address generator and column decoder and including a read column address generator, a write column address generator and a column address control circuit for switching read and write column address generated from the read and write column address generators, wherein address identity data are simultaneously inputted and outputted through switching of internal column addresses for reading and writing.

10 Claims, 8 Drawing Sheets

SEMICONDUCTOR MEMORY AND VIDEO SIGNAL PROCESSING CIRCUIT HAVING THE SAME

This application is a continuation of application Ser. No. 07/429,527 filed Oct. 31, 1989 now abandoned.

BACKGROUND OF THE INVENTION

This invention relates to a semiconductor memory, to and from which data can be continuously inputted and outputted. A prior art semiconductor memory of this type will now be described in connection with 4-bit parallel data processing with reference to FIG. 1 and 2.

Figure 1:
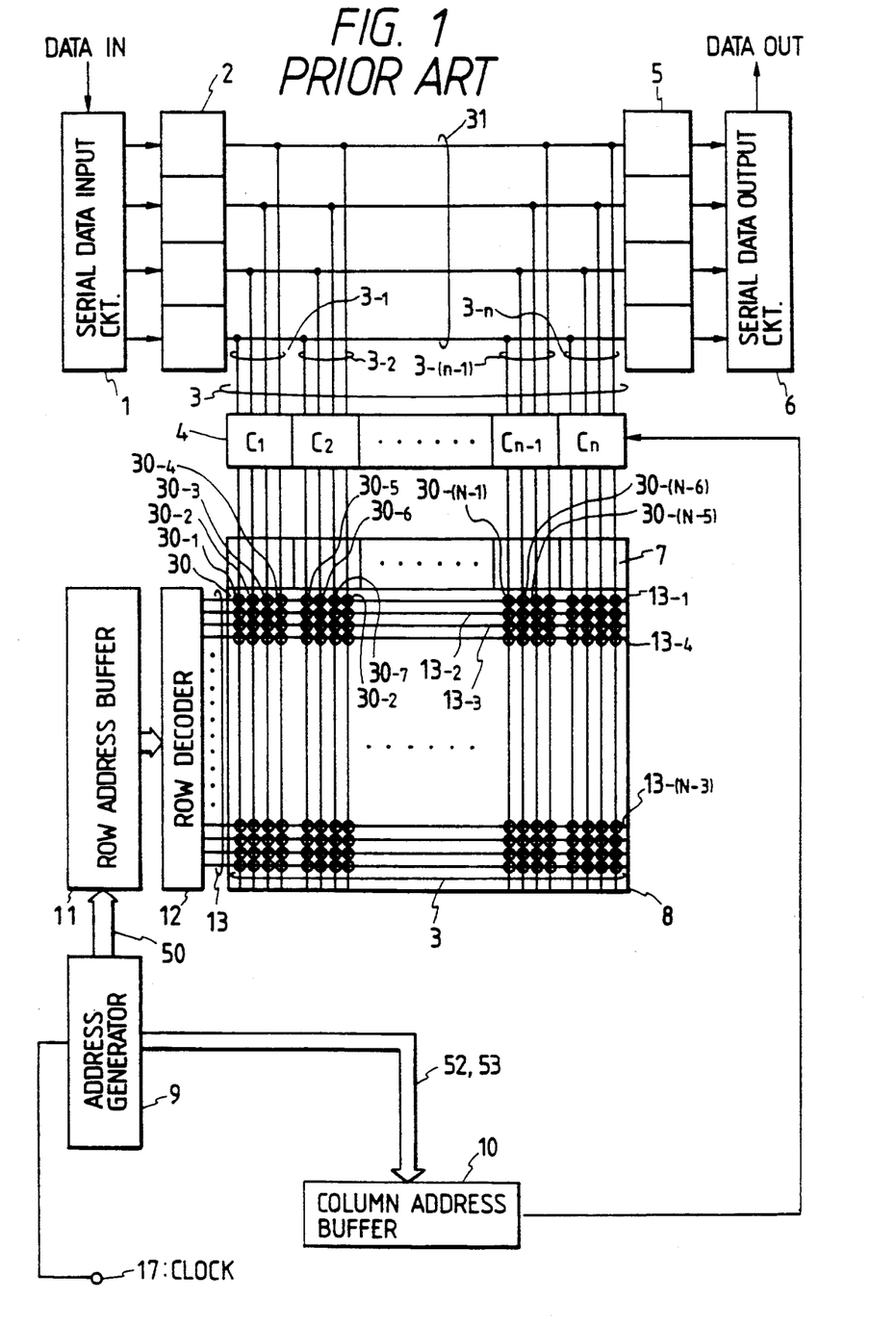
FIG. 1 is a block diagram showing a prior art semiconductor memory.

FIG. 1 is a block diagram showing a prior art semiconductor memory. Referring to FIG. 1, reference numeral 1 designates a serial data input circuit, 2 a writing circuit, 3 bit lines, 4 a column decoder, 5 a reading circuit, 6 a serial data output circuit, 7 a sense amplifier, and 8 a memory cell array. In memory cell array 8, memory cells 30 are connected to word lines 13 and bit lines 3. Reference numeral 9 designates an address generator, 10 a column address buffer, 11 a row address buffer, 12 a row decoder, 17 a clock signal, and 32 data transfer lines. Serial data input circuit 1 and writing circuit 2 connected thereto function to convert continuously supplied input data into 4-bit parallel data and supply these 4-bit parallel data through bit lines 3 to column decoder 4. Reading circuit 5 and serial data output circuit 6 connected thereto function to sequentially and continuously provide 4-bit data read out through column decoder 4. Serial data input and output circuits 1 and 6 are constituted by shift registers or the like. Column decoder 4 consists of a plurality of 4-bit column groups C1 to Cn.

Bit lines 3 extend through column decoder 4 and sense amplifier 7 into memory cell array 8 and are connected to respective pluralities of memory cells 30. Address generator 9 designates read or write addresses of memory cell array 8 to provide instructions to column and row decoders 4 and 12 through respective column and row address buffers 10 and 11, which can temporarily store addresses for every 4 bits. The temporarily stored addresses are instructed from column and row decoders 4 and 12 as respective intersections of bit and word lines 3 and 13.

The operation of the prior art semiconductor memory having the above construction will now be described with reference to FIG. 1 and operational timing chart of FIG. 2.

Referring to FIG. 1, clock 17 for generating a sync signal is connected to address generator 9. Row address signal 50 from address generator 9 is supplied through row address buffer 11 to row decoder 12 to activate a word line corresponding to the row address represented by the signal, for instance word line 13-1. Meanwhile, data supplied to serial data input circuit 1 as 4-bit parallel data is supplied to writing circuit 2. At the same time, according to column address signal 52 from address generator 9 a corresponding column group, for instance column group C1, is selected through column address buffer 10 to activate bit line 3-1 connected to selected column group C1.

When bit line 3-1 connected to column group C1 of column decoder 4 activated, data B1 is read out from memory cells 30-1 to 30-4 connected to activated word line 13-1 and activated bit line 3-1. More specifically, data B1 is read out from memory cell array 8 through bit line 31, sense amplifier 7, column group C1 in sense amplifier 7 and reading circuit 5. Then, write address 53 is supplied to column group C1, and data A1 is written by writing circuit 2 through sense amplifier 7 and bit line 3-1 in memory cells 30-1 to 30-4 connected to activated word line 13-1 and activated bit lines 3-1 of memory cell array 8.

Then, with word line 13-1 held in the activated state, column group C2 is selected as column address 52, and data B2 in memory cells 30-1 to 30-4 is read out. Then, column group C2 is selected as write address 53, and data A2 is written in memory cells 30-5 to 30-8. In the above way, data is read out from and written in memory cells connected to word line 13-1. After the reading and writing of data are done sequentially with respect to memory cells connected to one word line 13-1, a different word line, for instance word line 13-2, is activated, and like sequence of operations is performed.

Figure 2:
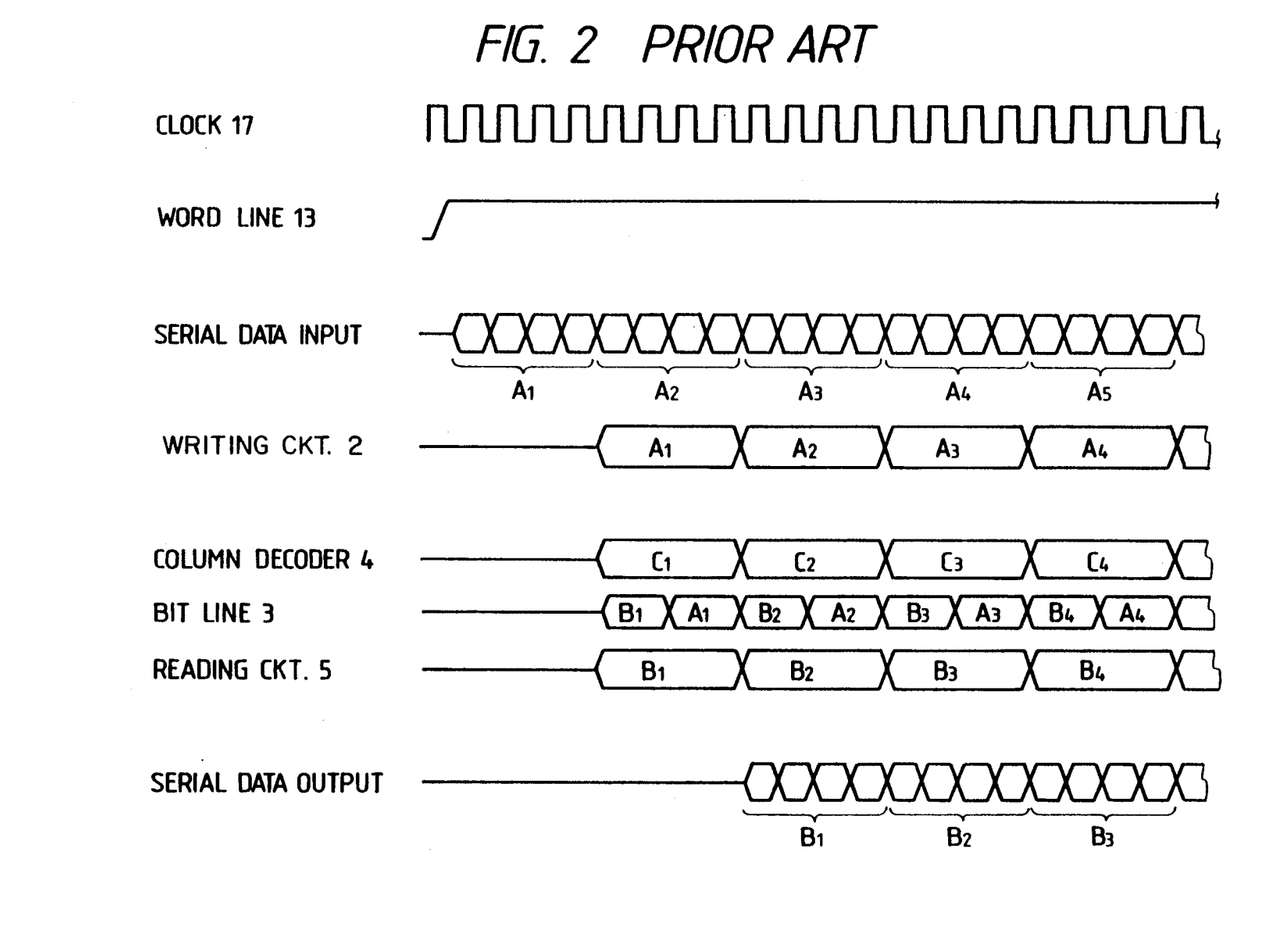
FIG. 2 is a timing chart for explaining the operation of the prior art semiconductor memory.

As shown in FIG. 2, a delay time until input data is written as data A1 in memory cell array 8 and a delay time until data B1 read out from memory cell array 8 is provided as serial data are produced. These delay times are attributable, in addition to ordinary writing delays, greatly to delay produced at least for 4 bits when continuously supplied input data is converted in serial data input circuit 1 into 4-bit parallel signal and when 4-bit parallel signal is converted in serial data output circuit 6 into continuous data. Therefore, there result absence of data when 4-bit data 1 is supplied and input of data 3 when data B1 is provided.

Figure 3:
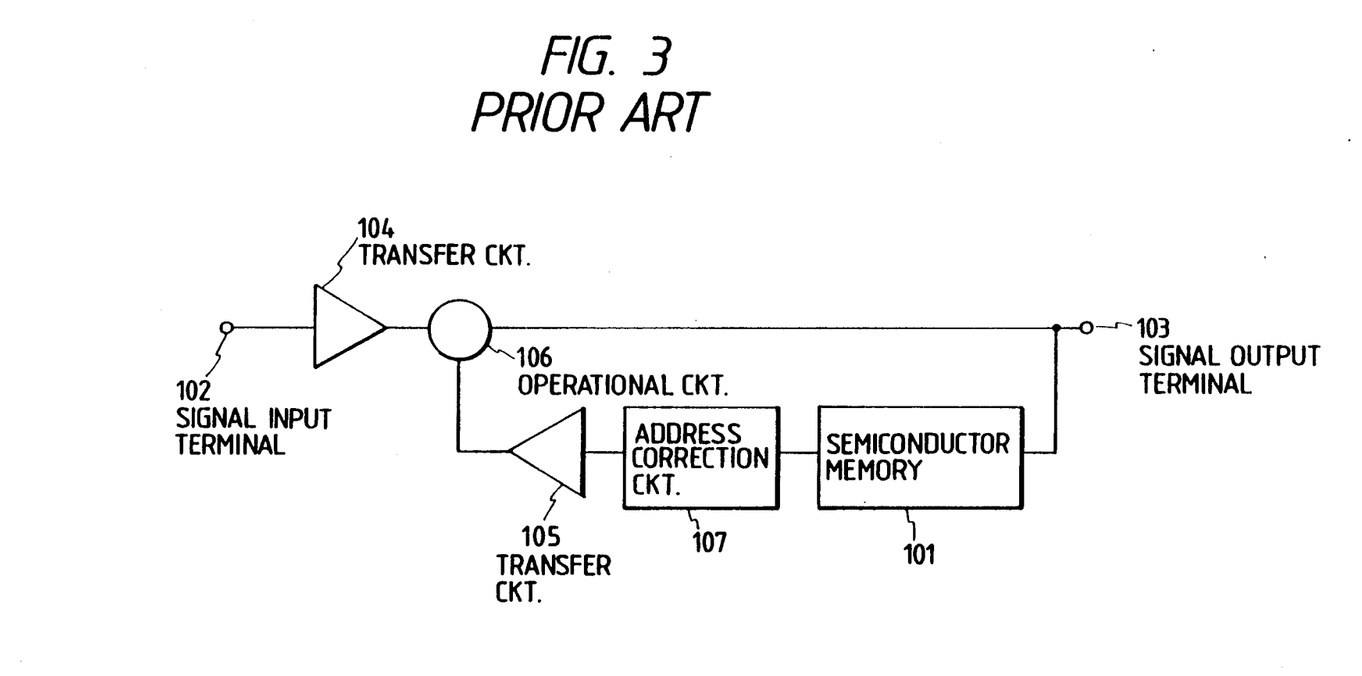
FIG. 3 is a block diagram showing a video signal processing system using a prior art semiconductor memory.

Therefore, the prior art semiconductor memory has a problem in that the address of serial data output simultaneously with serially input data is not identical. This problem will be discussed in detail with reference to FIG. 3. FIG. 3 shows a prior art video signal processing system. In FIG. 3, reference numeral 101 designates a semiconductor memory storing signal, 102 a signal input terminal, 103 a signal output terminal, 104 and 105 transfer circuits for transferring signals, 106 an operational circuit for processing signals from transfer circuits 104 and 105. A video signal for one frame is supplied to signal input terminal 102 and transferred through transfer circuit 104 to operational circuit 106. Meanwhile, a video signal stored in semiconductor memory 101 is transferred through transfer circuit 105 to operational circuit 106. Operational circuit 106 processes the two video signals to produce an output which is provided from output terminal 103. This system is utilized when detecting a motion in video or when compensating for deviation or noise of image display. The signals from transfer circuit 104 and 105, which are processed in operational circuit 106, form one frame and, therefore, should be identical with one another in address. Therefore, when the video signal processing system as shown in FIG. 3 uses the prior art semiconductor memory, there arises a lack of address identity of combined video signals, and it is necessary to effect an address correction provide address identity, which is an inconvenient step. More specifically, lack of address identity of simultaneously input and output data dictates provision of address correction circuit 107 and the like when incorporating a prior art semiconductor memory in a system using different elements, for instance the video signal processing system shown in FIG. 3, to permit correction such as to permit simultaneous input and output of identical address data. This means that delay circuits and other elements have to be assembled separately for use, thus increasing the number of elements in use.

SUMMARY OF THE INVENTION

The present invention seeks to provide a semiconductor memory, to which and from which address identity data are simultaneously inputted and outputted.

According to the invention, there is provided a semiconductor memory, which comprises a writing circuit for dividing data continuously supplied to a serial data output circuit for continuously providing data read out a plurality of bits at a time by a reading circuit, a memory cell array including a column decoder and a row decoder, column and row address buffers for instructing addresses for a plurality of bits at a time to said respective column and row decoders, an address generator, and a circuit provided between said address generator and column decoder and including a read column address generator, a write column address generator and a column address control circuit for switching read and write column address generated from said read and write column address generators, wherein address identity data are simultaneously inputted and outputted through switching of internal column addresses for reading and writing.

With this construction, writing and reading of data with respect to the memory cell array are executed using a write column address and a read column address deviated by a predetermined address portion from the write column address for respective write and read cycles. Thus, address identity are inputted and outputted as input and output data from and to other circuits. Thus, address identity data can be continuously inputted and outputted.

DETAILED DESCRIPTION OF THE INVENTION

First Embodiment

A first embodiment of the invention will now be described with reference to FIGS. 4 and 5.

Figure 4:
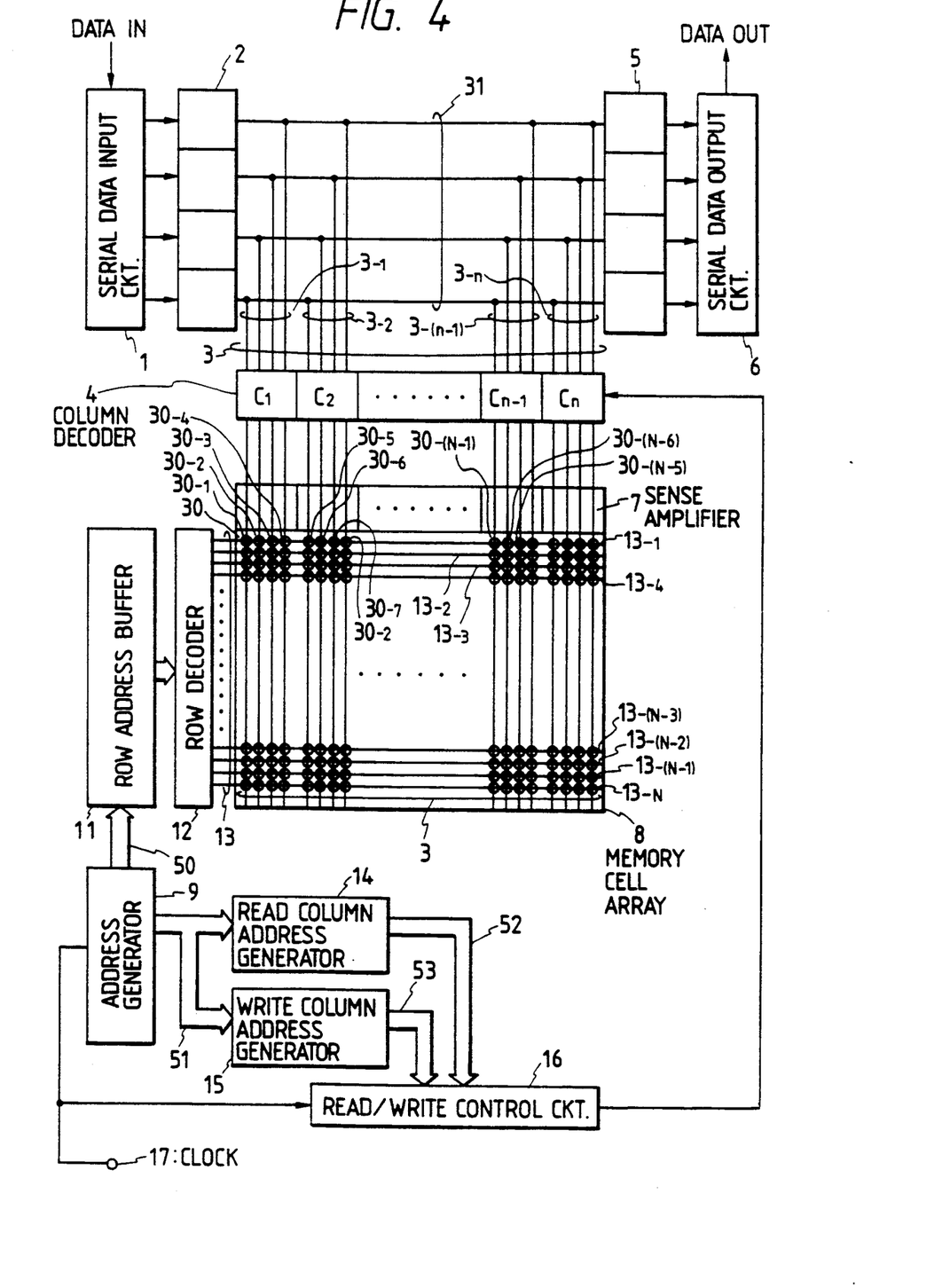
FIG. 4 is a first embodiment of the semiconductor memory according to the invention.
Figure 5:
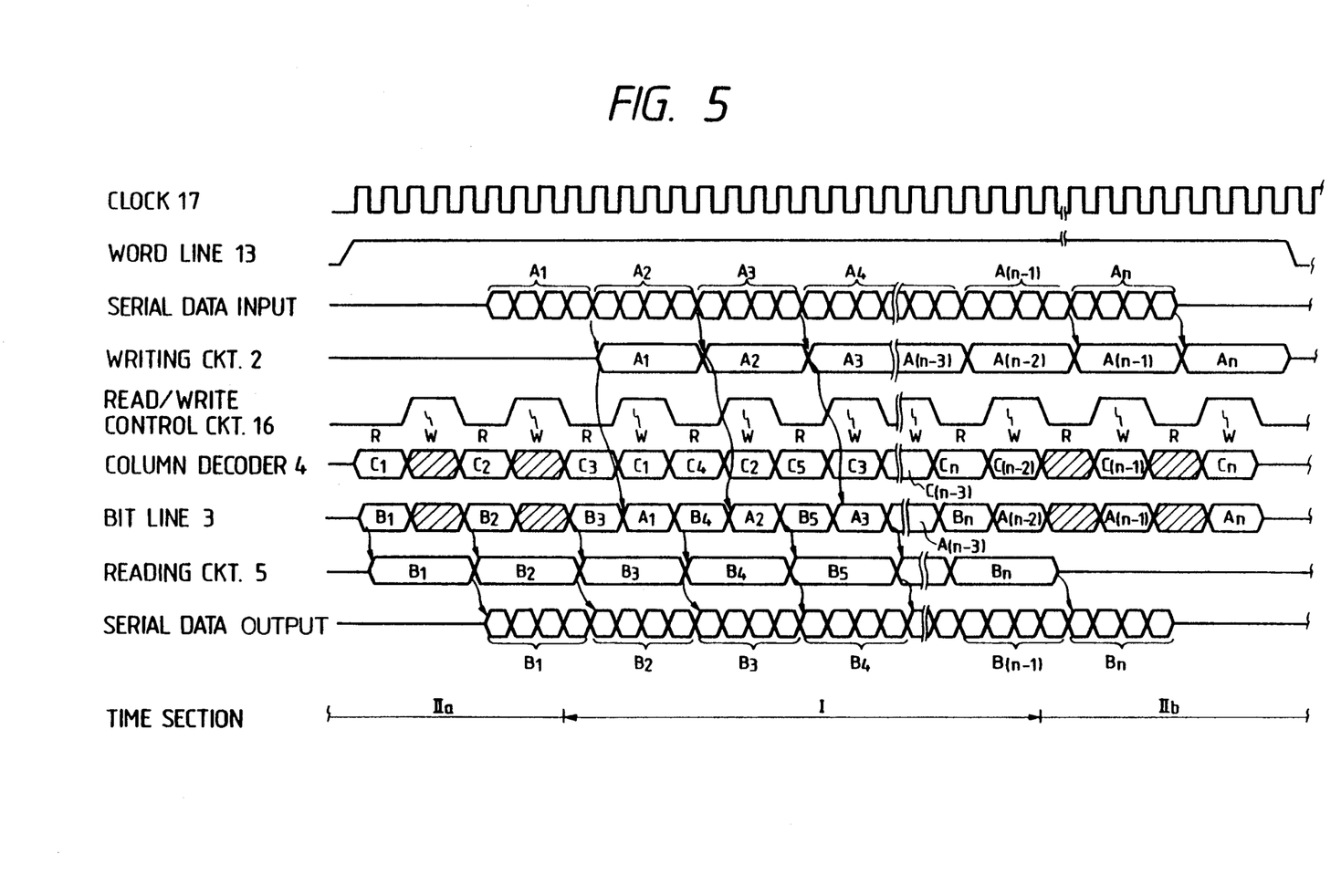
FIG. 5 is a timing chart for explaining the operation of the same embodiment.

FIG. 4 is a block diagram showing a first embodiment of the semiconductor memory according to the invention.

This first embodiment is different from the prior art example shown in FIG. 1 in that there are provided, in lieu of column address buffer 10, read column address generator 14, write column address generator 15 and read/write control circuit 16 for switchingly supplying read and write column addresses 52 and 53 generated from respective read and write column address generators 14 and 15 to column decoder 4. Read and write column address generators 14 and 15 each includes a counter and an arithmetic unit. The other part of the embodiment is like the prior art example, and like parts are designated by like reference numerals and are not described any further.

The operation of the semiconductor memory having the above construction will now be described with reference to the block diagram of FIG. 5 and operational timing chart of FIG. 4.

Row address signal 50 of address generator 9 is supplied through row address buffer 11 to row address 12 to activate word line 13 corresponding to the represented row address. Meanwhile, according to column address signal 51 from address generator 9, write and read column address generators 15 and 14 generate respective write and read addresses 53 and 52. Write column address 53 is delayed behind read column address 52 by a delay time, which is the sum of delay time until input data is written in memory cell array 8 and delay time until data read out from memory cell array 8 is provided as serial data. In this embodiment, when C3 is generated as read column address 52 in a read/write cycle with respect to a memory cell array, C1 is subsequently generated as write column address 53. Likewise, when C4, C5, . . . are generated as read column address 52, C2, C3 . . . are generated as write column address. These addresses are supplied to column decoder 4.

Column decoder 4, which receives write and read column addresses 53 and 52 from read/write control circuit 16 at the time of writing and at the time of reading, respectively, selects a corresponding block from column decoder 4. It is now assumed that one word line 13, for instance word line 13-1, is activated. In the read cycle, C4 is selected from column decoder 4 according to read column address 52 generated from read column address generator 14 controlled by read/write control circuit 16. Consequently, 4-bit data are provided simultaneously from four memory cells 30-9 to 30-12 in memory cell array 8 at the intersections between activated word line 13-1 and bit lines 3 connected to C3 through bit line 3 connected to C3 in column decoder 4 and sense amplifier 7 to reading circuit 5. Serial data output circuit 6 converts the 4-bit data to provide continuous data.

Data A1 continuously supplied to serial data input circuit 1 is supplied 4 bits at a time to writing circuit 2. At the time of writing, C1, for instance, selected is from column decoder 4 by column address 53, generated by write column address generator 15, and is controlled by read/write control circuit 16. In the write cycle subsequent to the read cycle, 4 bits of data are simultaneously written through sense amplifier 7 in memory cells 30-1 to 30-4 at the intersections of word line 13-1 in memory cell array 8 and bit lines 31 connected to C1 in column decoder 4.

Then at the time of reading, with word line 13-1 held in the activated state, C4 is selected as read column address 52, and data are read out from memory cells 30-13 to 30-16 in memory cell array 30 at the intersections between word line 13-1 and bit lines 35 connected to C4 in column decoder 4. Then, C2 is supplied as write address 53, and data is written in memory cells 30-5 to 30-8 of memory cell array 8 at the intersection between word line 13-1 and bit lines 32 connected to C2 in column decoder 4.

In this way, the reading and writing of data are executed sequentially with respect to memory cells connected to word line 13-1. After the reading and writing of data with respect to the memory cells connected to word line 13-1, a different word line, for instance word line 13-2, is activated for like operation.

As shown in FIG. 4, a delay is produced while serial data A1 passes through serial data input circuit 1 before being written through column decoder C1, data A2 is provided when data A1 actually written in memory cell array 8. Meanwhile, a delay is produced until data B2 read out from memory cell array 8 is provided through serial data output circuit 6. Therefore, data B3 is read out from memory cell array 8 when data B3 is provided to the outside.

Thus, data A2 and B3 are serially inputted and outputted with respect to the outside when data B3 and A1 are respectively read out and written in memory cell array 8. In FIG. 5, only a delay caused by the passage of data through serial data input circuit 1 and delay caused by the passage of data through serial data output circuit 6 are shown as main delays. In the actual semiconductor memory, however, it is of course necessary to take wiring delays into considerations.

Where addresses are supplied externally, instead of address generator 9, the row address is likewise supplied to row address buffer 11, and column address is likewise supplied to read column address generator 14 and write column address generator 15.

As has been shown, in this embodiment address identity data can be continuously inputted and outputted with respect to one word line 13 by switching internal column addresses at the time of reading and at the time of writing read and write column address generators 14 and 15 and read/write control circuit 16.

Second Embodiment

Now, a second embodiment of the invention will be described with reference to FIGS. 6 and 7.

Figure 6:
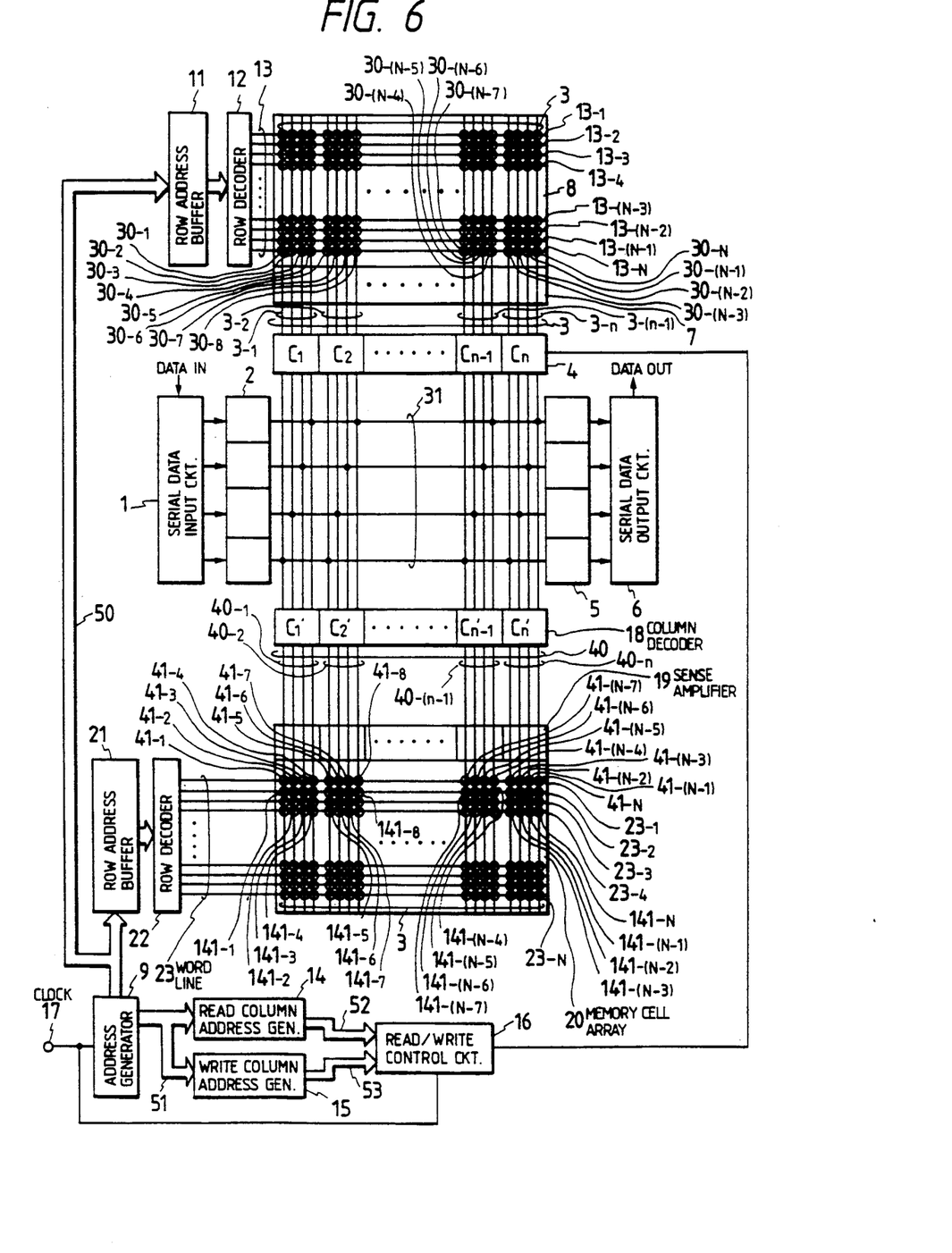
FIGS. 6 and 7 are a block diagram and a timing chart, respectively, for explaining a second embodiment of the semiconductor memory according to the invention.

FIG. 6 is a block diagram showing the second embodiment of the semiconductor memory according to the invention.

This second embodiment is different from the first embodiment shown in FIG. 4 in that column decoder 18, sense amplifier 19 and memory cell array 20 are connected to the other ends of bit lines 3 and that row address buffer 21, row decoder 22 and a set of word lines 23 connected to memory cells of memory cell array 20 are connected to address generator 9. The other part of this embodiment is like the first embodiment, and like parts are designated by like reference numerals and are not described any further.

The operation of the semiconductor memory having the above construction will now be described with reference to FIG. 6 and operational timing chart of FIG. 7.

Figure 7:
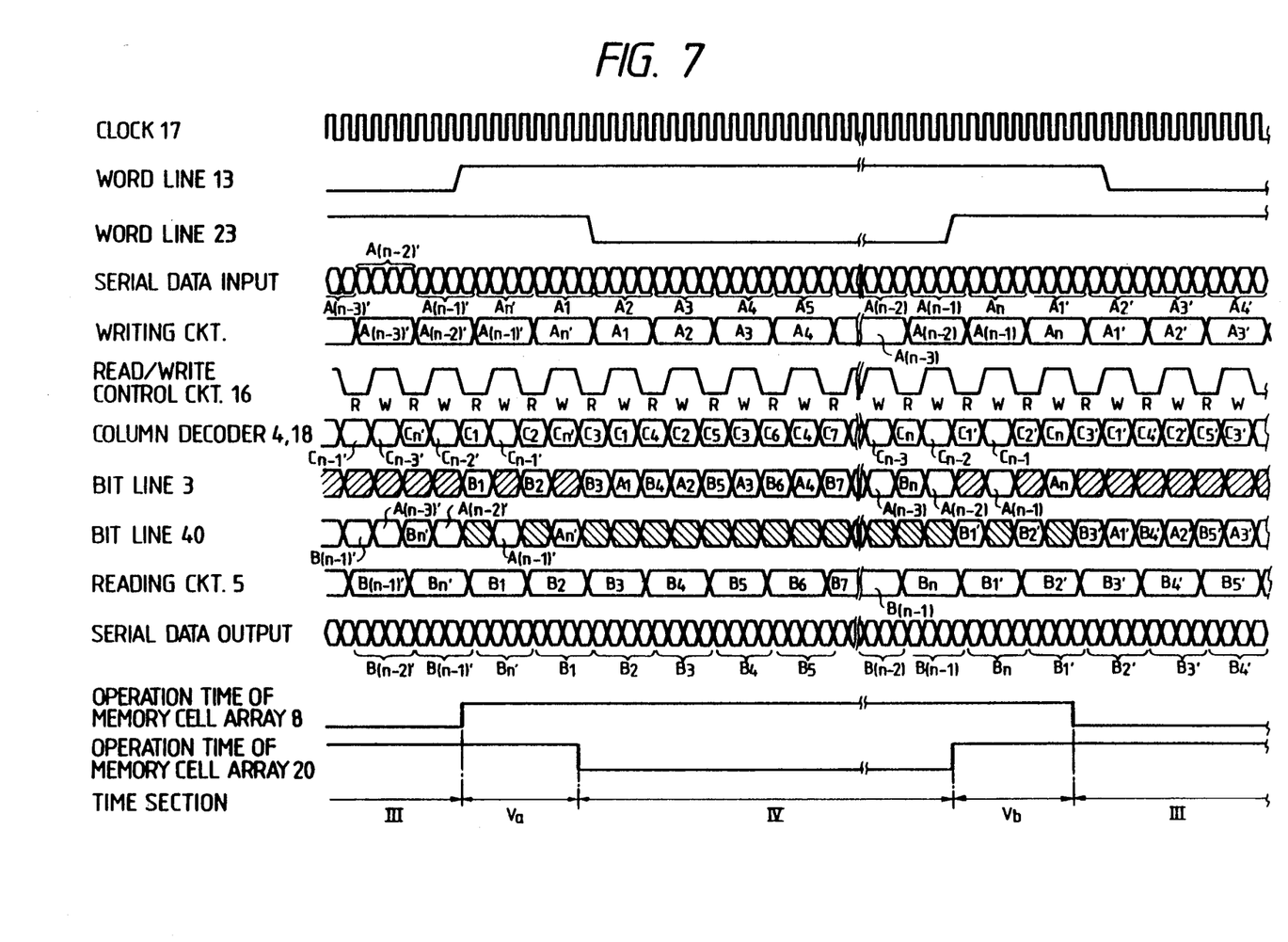

As shown in FIG. 7, in this embodiment there are provided time section III, in which only memory cell array 20 is operated, time section IV, in which only memory cell array 8, and time sections Va and Vb, in which both memory cell arrays 8 and 20 are operated. The operations in time sections III and IV are like operation in time section I in FIG. 5 in the first embodiment. In this embodiment, the problem of discontinuation of input and output of data in sections IIa and IIb according to the first embodiment is solved by providing and operating two memory cell arrays 8 and 20.

In this embodiment, row address signal 50 generated by address generator 9 is coupled through two row address buffers 11 and 21 and row decoders 12 and 22 connected thereto respectively to alternately select and activate word lines 13 and 23 corresponding to the represented row address.

Meanwhile, write and read column address generators 15 and 14, to which column address signal 51 of address generator 9 is supplied, generate respective write and read column addresses 53 and 52.

Write column address 53 is delayed behind read column address by a time period equal to the sum of the delay time until input data is written in memory cell arrays 8 and 20 and delay time until data read out from memory cell arrays 8 and 20 are provided as serial data, as in the first embodiment.

Since the operations in time sections III and IV in FIG. 7 are like that in time section I in FIG. 5 according to the first embodiment, only operations in time sections Va and Vb will be described hereinunder. In time section III, with word line 23-1, for instance, of memory cell array 20 in the activated state a reading operation with respect to memory cells 41-9 to 41-N and a writing operation with respect to memory cells 41-1 to 41-(N-8) are executed. In time section Va, to eliminate discontinuity of input and output of data, with word line 23-1 held activated word line 13-1 is activated, thus reading out data from memory cells 30-1 to 30-4 in memory cell array 8 and writing data in memory cells 41-(N-7) to 41-(N-4) of memory cell array 20. Subsequently, data in memory cells 30-5 to 30-8 of memory cell array 8 are read out, and then data is written from memory cell 41-(N-3) of memory cell array 20 in memory cell 41-N thereof. In time section IV, with word line 13-1, for instance, of memory cell array 8 held activated, a reading operation with respect to memory cells 30-9 to 30-N is executed, a writing of data from memory cell 30-1 to memory cell 30-(N-8) is executed. In time section Vb, to eliminate discontinuity of input and output of data, as in time section Va, with word line 13-1 held activated word line 23-2 is activated, data are read out from memory cells 141-1 to 141-4 of memory cell array 20, and then data are written in memory cells 30(N-n) to 30-(N-4) of memory cell array 8. Subsequently, data are read out from memory cells 141-5 to 141-8 of memory cell array 20, and then data are written in memory cells 30-(N-3) to 30-N of memory cell array 8. In this way, operations in time sections Va, IV, Vb and III are performed by alternately selecting word lines 18 and 23. In this embodiment, it is possible to obtain continuous input and output of data.

As has been shown, in this embodiment internal column addresses for reading and writing are switched by read and write column address generators 14 and 15 and read/write control circuit 16, and reading and writing operations with respect to memory cell arrays 8 and 20 alternately for word lines 13 and 23. In this way, it is possible to realize address identity data input and output.

While in this second embodiment the memory cell array is divided into two blocks, it is possible to divide the memory cell array into any desired number of blocks depending on the number of memory cells, layout, memory capacity and bit line capacity ratio of memory cells and various other conditions.

Third Embodiment

A third embodiment of the invention will now be described with reference to FIG. 8.

Figure 8:
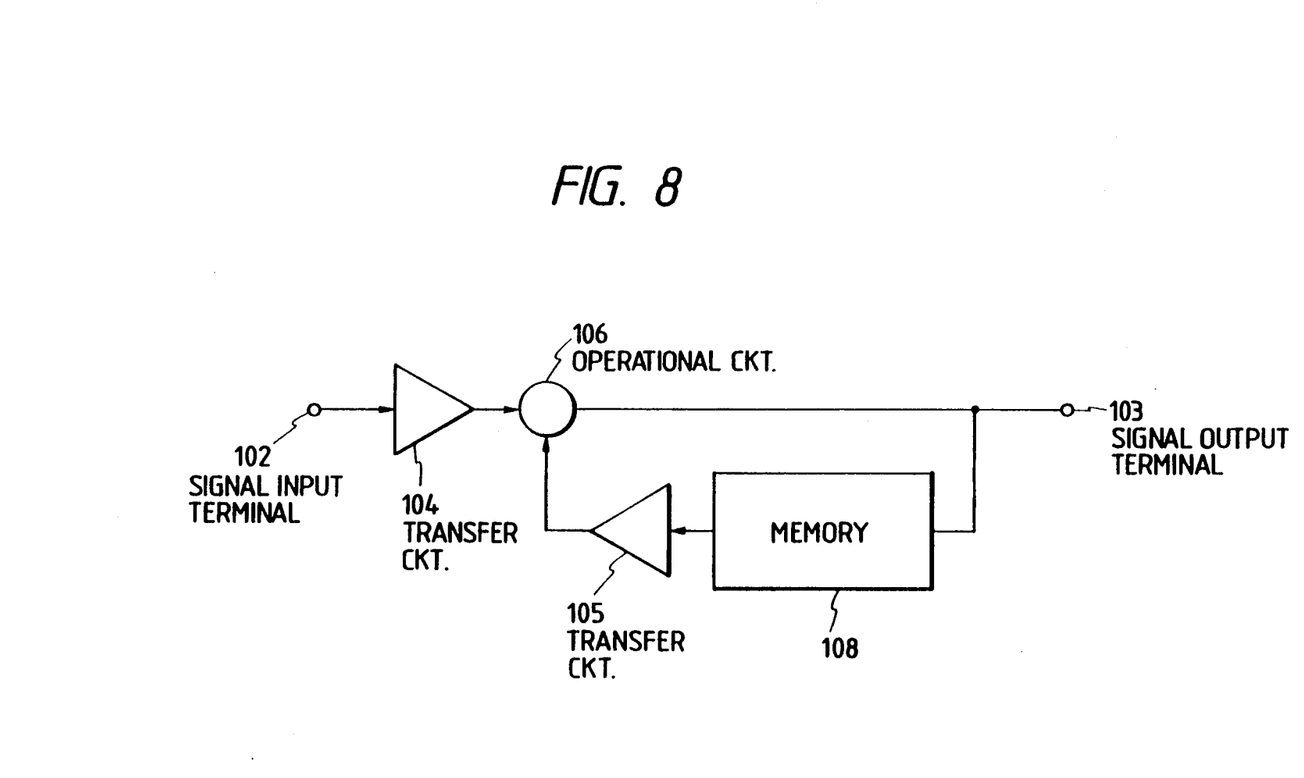
FIG. 8 is a block diagram showing an image signal processing system.

FIG. 8 is a block diagram showing the third embodiment of the semiconductor memory according to the invention.

The system shown in FIG. 8 is an example of video signal processing system employing the semiconductor memory according to the invention. Reference numeral 108 designates the first or second embodiment of semiconductor memory, which stores a video signal of an immediately preceding frame. Video signal stored in semiconductor memory 101 is transferred through transfer circuit 105 to operational circuit 106. Also, video signal of the present frame is supplied from signal input terminal 102 to be transferred through transfer circuit 104 to operational circuit 106. Operational circuit 106 processes both the video signals to provide an output, which is provided from output terminal 103. Video signal of the present frame is stored in memory 108 as soon as it is supplied to operational circuit 106. This system is used for detecting a motion in video or for compensating for deviation or noise of the display. It may be utilized for TVs, VTRs, video disk players, video cameras and other video apparatuses. The signals from transfer circuits 104 and 105 which are processed in operational circuit 106, are one-frame signals, and hence their addresses have to be identical. Accordingly, when the semiconductor memory according to the invention is used for the video signal processing system shown in FIG. 8, the combined video signals are identical in address. Therefore, unlike the case of using the prior art semiconductor memory, the video signal processing system does not require external address correction, and thus the semiconductor memory according to the invention can be used more conveniently.

While in the above embodiment video signal for the present frame is stored in memory 108 as soon as it is supplied to operational circuit 106, it is also possible to store the result of operation as soon as the result is provided from operational circuit 106.

What is claimed is:

1. A semiconductor memory comprising a writing circuit for dividing data continuously supplied to a serial data input circuit into groups of data each group having a plurality of bits, a reading circuit for reading out groups of bits at a time, a serial data output circuit for providing a sequence of data bits representing data read out in groups by said reading circuit, a memory cell array including a column decoder and a row decoder, a row address buffer for providing addresses for a plurality of bits at a time to said row decoder, an address generator, and a circuit provided between said address generator and said column decoder,
said circuit including a read column address generator, a write column address generator and a column address control circuit for interchanging addresses applied to said memory cell array between read and write column addresses generated by said read column address generator and said write column address generator,
wherein said read column address generator and said write column address generator include means for time shifting addresses generated by said address generator thereby to enable data for a particular address in the memory cell array to be inputted to the memory substantially simultaneously with output of data from said particular address by internally changing column addresses for reading and writing.

2. The semiconductor memory according to claim 1, wherein said memory cell array is divided into a plurality of blocks, each of said blocks being provided with a row address buffer and a row decoder for address instruction.

3. A semiconductor memory comprising a writing circuit for dividing data continuously supplied to a serial data input circuit into groups of data each group having a plurality of bits, a reading circuit for reading out groups of bits at a time, a serial data output circuit for providing a sequence of data bits representing data read out in groups by said reading circuit, a memory cell array including a column decoder and a row decoder, a row address buffer for providing addresses for a plurality of bits at a time to said row decoder, an address generator, and a circuit provided between said address generator and said column decoder,
said circuit including a read column address generator, a write column address generator and a column address control circuit for interchanging addresses applied to said memory cell array between read and write column addresses generated by said read column address generator and said write column address generator,
wherein said read column address generator and said write column address generator include means for time shifting addresses generated by said address generator thereby to enable data for a particular address in the memory cell array to be inputted to the memory substantially simultaneously with output of data from said particular address by internally changing column addresses for reading and writing;
said memory cell array being divided into a plurality of blocks, each of said blocks being provided with a row address buffer and a row decoder for address instruction, word lines of said individual blocks being activated alternately, and
time section means for overlappedly activating word lines of the individual blocks, thus permitting continuous input and output of serial data.

4. The semiconductor memory according to claim 3, wherein said memory cell array is divided into two blocks.

5. A video signal processing system comprising:

a semiconductor memory to which and from which data are substantially simultaneously inputted and outputted to identical addresses including internal means for internally changing a common column address generated at a predetermined time identifying a predetermined memory seqment to provide a read address and a write address for reading and writing data from and to said predetermined memory segment, wherein said internal means includes means for time shifting said common column address by different respective amounts to provide said write address and said read address thereby to enable said simultaneous input and output of data to an identical address,
a first transfer circuit for transferring image data stored in said semiconductor memory,
a second transfer circuit for transferring present image data, and an operational circuit for processing first and second image data from said respective first and second transfer circuits, said first and second image data being data of identical addresses.

6. A semiconductor memory comprising:

a memory cell array having segments;

an input circuit receiving an input signal;

writing means connected between the input circuit and the memory cell array for writing the received input signal into a first segment of the memory cell array at a moment which is delayed by a first predetermined delay time from a moment when the input signal is received by the input circuit;

reading means connected to the memory cell array for reading a signal from a second segment of the memory cell array;

an output circuit connected to the reading means and outputting the signal read by said reading means as an output signal at a moment which is delayed by a second predetermined delay time from a moment when the signal from the second segment of said array is read by the reading means; and selecting means for selecting said first segment of the memory cell array into which the writing means will write an input signal received at a particular moment in time by the input circuit to be substantially identical to said second segment of the memory cell array from which an output signal being outputted at said particular moment in time by the output circuit was read by the reading means.

7. A semiconductor memory as recited in claim 6, wherein said selecting means comprises means for shifting a write address identifying said first segment of the memory cell array by a first time-shift amount relative to time and for shifting a read address identifying said second segment of the memory cell array by a second time-shift amount relative to time, thereby to provide at said particular moment in time output data from the same segment of the memory cell array into which an input signal received by the input circuit at said particular moment of time will be written by the writing means.

8. A semiconductor memory as recited in claim 6, further including address generating means responsive to a clock signal for generating a sequence of addresses in the memory cell array, and wherein said selecting means comprises:

write address generating means for shifting an address generated at a predetermined time by said address generating means by a first time-shift amount to generate a write address identifying said first segment of the memory cell array, and read address generating means for shifting said address generated at said predetermined time by said address generating means by a second time-shift amount to generate a read address identifying said second segment of the memory cell array, said read address generating means and said write address generating means thereby generating addresses for accessing a common segment of the memory cell array at different times to enable the output circuit to provide said output signal from said common segment at said particular moment in time when the input signal to be written in said common segment is being received by the input circuit.

9. A semiconductor memory as recited in claim 8, wherein said write address generating means and said read address generating means comprise delay means for shifting said address generated by said address generating means at said predetermined time by shift times providing said write address for said common segment at a time delayed from said read address for said common segment by a delay corresponding to a sum of said first and second predetermined delay times.

10. A semiconductor memory as recited in claim 8, wherein said write address generating means and said read address generating means comprise delay means for shifting said address generated by said address generating means at said predetermined time by shift times providing said write address for said common segment at a time delayed from said read address for said common segment by a delay substantially equal to a sum of said first and second predetermined delay times.

* * * * *